United States Patent
Schemmann et al.

(10) Patent No.: US 9,013,709 B2
(45) Date of Patent: Apr. 21, 2015

(54) METHOD AND DEVICE FOR DETECTING MOTION

(75) Inventors: Marcel Schemmann, Maria Hoop (NL); Cristian Presura, Eindhoven (NL); Carsten Heinks, Nordhorn (DE); Atanas Pentchev, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 594 days.

(21) Appl. No.: 13/260,747

(22) PCT Filed: Mar. 24, 2010

(86) PCT No.: PCT/IB2010/051270
§ 371 (c)(1),
(2), (4) Date: Jan. 4, 2012

(87) PCT Pub. No.: WO2010/113076
PCT Pub. Date: Oct. 7, 2010

(65) Prior Publication Data
US 2012/0092675 A1    Apr. 19, 2012

(30) Foreign Application Priority Data
Mar. 31, 2009 (EP) .................... 09156804

(51) Int. Cl.
*G01B 11/02* (2006.01)
*G01P 3/36* (2006.01)
(Continued)

(52) U.S. Cl.
CPC ........... *G01P 3/366* (2013.01); *G01S 7/4911* (2013.01); *G01S 17/58* (2013.01); *G06F 3/0317* (2013.01); *G01S 7/4916* (2013.01); *H01S 5/06216* (2013.01); *H01S 5/0622* (2013.01)

(58) Field of Classification Search
CPC ....... G01P 3/366; G01S 17/58; G01S 7/4812; G01S 7/4916; G01B 9/02092; H01S 3/1028; H01S 5/0427; H01S 5/06808; H01S 5/06821; H01S 5/0687
USPC ......... 356/28.5, 498, 28; 345/166; 372/38.07, 372/44.01, 81, 29.01, 29.015, 29.023, 32
See application file for complete search history.

(56) References Cited

U.S. PATENT DOCUMENTS 4,669,876 A * 6/1987 Dopheide .................... 356/28.5
4,927,263 A * 5/1990 de Groot et al. ............. 356/5.09
(Continued)

FOREIGN PATENT DOCUMENTS

GB    2443662 A    5/2008
JP    2001230486 A    8/2001
(Continued)

OTHER PUBLICATIONS

Avetisov et al. (High-resolution absorption measurements by use of two-tone frequency-modulation spectroscopy with diode lasers) /Jun. 20, 1997/vol. 36, No. 18/Applied Optics/pp. 4043-4054.*

(Continued)

*Primary Examiner* — Kara E Geisel
*Assistant Examiner* — Rufus Phillips
(74) *Attorney, Agent, or Firm* — Yuliya Mathis

(57) ABSTRACT

A method for detecting motion direction of an object (4) comprises the steps of:
  laser output light (L1) is generated, using a semiconductor laser (2) having a thermal response frequency (fr);
  the laser is driven with rectangularly modulated DC current (I) having a modulation frequency higher than said thermal response frequency (fr) and preferably higher than twice said thermal response frequency (fr), such as to triangularly modulate the wavelength of the laser output light;
  the laser output light is directed to the object;
  a portion of reflected light (L3) is allowed to interfere with light (L0) within the laser;
  a portion of the laser light is used as measuring beam (5);
  the frequency spectrum of the measuring beam (5) is analyzed in conjunction with the modulated laser current in order to determine the direction of movement of the object (4).

7 Claims, 5 Drawing Sheets

(51) Int. Cl.
*G01S 7/491* (2006.01)
*G01S 17/58* (2006.01)
*G06F 3/03* (2006.01)
*H01S 5/062* (2006.01)

(56) References Cited

U.S. PATENT DOCUMENTS

| | | | |
|---|---|---|---|
| 5,600,442 A * | 2/1997 | Minegishi et al. | 356/498 |
| 6,233,045 B1 * | 5/2001 | Suni et al. | 356/28.5 |
| 6,707,027 B2 * | 3/2004 | Liess et al. | 250/221 |
| 6,721,346 B2 * | 4/2004 | Inoue et al. | 372/75 |
| 6,885,438 B2 * | 4/2005 | Deines | 356/28.5 |
| 7,085,297 B2 * | 8/2006 | Senga et al. | 372/38.07 |
| 7,126,586 B2 * | 10/2006 | Jianping et al. | 345/166 |
| 7,339,683 B2 | 3/2008 | Weijers et al. | |
| 7,557,795 B2 * | 7/2009 | Kong et al. | 345/156 |
| 2005/0213106 A1 | 9/2005 | Weijers et al. | |
| 2007/0002013 A1 | 1/2007 | Kong et al. | |

FOREIGN PATENT DOCUMENTS

| | | |
|---|---|---|
| JP | 2004-343089 | 12/2004 |
| WO | 2002037410 A1 | 5/2002 |
| WO | 2003102717 A | 12/2003 |

OTHER PUBLICATIONS

Gustafsson et al. (Frequency-modulation spectroscopy with blue diode lasers)/Applied Optics/vol. 39, No. 21/Jul. 20, 2000.*

Cartledge et al., "Performance implications of the thermal-induced frequency drift in fast wavelength switched systems with heterodyne detection", 1996, pp. 1090-1096, vol. 14, No. 6.

Goldberg et al., "Time-dependent thermal effects in current-modulated semiconductor lasers", Electronic Letters, 1981, pp. 497-499, vol. 17, No. 14.

* cited by examiner

METHOD AND DEVICE FOR DETECTING MOTION

FIELD OF THE INVENTION

The present invention relates in general to a method for detecting movement of an object with respect to a sensor, or, vice versa, of the sensor with respect to the object. In a particular application, the sensor is associated with a user input device for a computer or the like, and the present invention will be specifically explained for this application, but it is to be noted that the invention is not limited to such application.

BACKGROUND OF THE INVENTION

FIG. 1 schematically illustrates an optical computer mouse 1, comprising a laser device 2. The laser device is implemented as a semiconductor laser, as known per se. The mouse is moved over a surface 4, for instance a desktop. From a power source not shown for sake of simplicity, the laser device 2 receives an electric current, and as a result the laser 2 emits a laser beam 3 with a certain wavelength, which is reflected by the surface 4. Part of the laser light is reflected back towards the laser. It is possible to derive, from this reflected laser light, a signal representing velocity of the movement of the mouse 1 with respect to the surface.

FIG. 2 is a schematic diagram illustrating the measuring principle. The laser 2 comprises a semi-transparent front mirror 11 and a semi-transparent rear mirror 12, with a laser medium 13 (semiconductor body) between said two mirrors. It is noted that the mirrors 11, 12 are shown as two-dimensional structures, but in practice the mirrors 11, 12 will have a layered structure.

The laser light within the laser medium 13 is indicated as main laser light L0. Part of the laser light passes the front mirror 11 and forms the output beam 3; this light is also indicated L1. Likewise, part of the laser light passes the rear mirror 12 and forms a measuring beam 5; this light is also indicated L2.

The object 4 can be considered to constitute an external mirror with diffuse properties, and reflects the incoming beam L1: this is indicated as a reflected beam L3. In the drawing, the reflected beam L3 is shown as being a one-dimensional beam making an angle with the incoming beam L1, but in practice the reflected beam L3 will have a certain spatial distribution and a portion of this reflected beam L3 will be directed towards the front mirror 11. Thus, the object 4 can be considered as defining an external cavity together with the front mirror 11.

Under stationary conditions, the light L0 within the laser medium 13 forms a standing wave. Likewise, light L1 and L3 in the external cavity forms a standing wave which, through the front mirror 11, interferes with the light L0 within the laser medium 13. The measuring beam 5 has a constant intensity.

Assume that the object 4 is moving away from the laser 2. This means that the length of the interference cavity between the front mirror 11 and the object 4 is increasing, i.e. the number of standing waves fitting between the front mirror 11 and the object 4 is increasing. Consequently, the interference state at the location of the front mirror 11 changes from fully constructive to fully destructive and back. This has influence on the interference state in the laser medium 13, which in turn has influence on the intensity of light L5 of the measuring beam 5. As a result, this light L5 has intensity fluctuations at a frequency fD that is proportional to the velocity of movement of the object 4 with respect to the laser 2, i.e. the component thereof along the optical axis. It should be clear that the measuring beam 5 can be detected by an optical sensor, and that its output signal can be processed by a signal processor in order to process these intensity fluctuations and to calculate the object velocity therefrom. It is noted that said frequency fD is equal to the Doppler frequency.

A problem in this respect is that the same explanation applies, irrespective of the object moving towards or away from the optical detector. In other words, with the simple measuring build-up as described above it is impossible to determine movement direction.

It has already been proposed to solve this problem by supplying the laser with a triangularly modulated laser current, as illustrated in FIG. 3A. The laser current is varied in a linear manner between two extreme values I1 and I2 having the same sign. During one half of a current period, the laser current I is increasing from I1 to I2, the change rate R1=dI/dt being substantially constant. During another half of a current period, the laser current I is decreasing from I2 to I1, the change rate R2=dI/dt being substantially constant; typically, R2=−R1. Increasing/decreasing the laser current causes an increase/decrease of the laser temperature (as illustrated in FIG. 3B), which in turn causes an increase/decrease of the wavelength of the laser light (as illustrated in FIG. 3C) with a substantially constant change rate dλ/dt, in which λ indicates the laser wavelength. The result can be explained as follows. Assume that the object is moving away from the laser, so that the length of the interference cavity between the front mirror 11 and the object 4 is increasing. If the current magnitude and hence the laser wavelength is also increasing, the frequency of the intensity fluctuations of measuring light L5 is reduced; this is illustrated by a peak f1 in the frequency spectrum of FIG. 3D. The reduced frequency may even become equal to zero if D/λ remains constant, in which D indicates the distance between the front mirror 11 and the object 4. Conversely, if the laser wavelength is decreasing, the frequency of the intensity fluctuations of measuring light L5 is increased; this is illustrated by a peak f2 in the frequency spectrum of FIG. 3B. It is noted that the shift |fD−f1| is equal to the shift |fD−f2|. The spectrum of the intensity fluctuations of measuring light L5 thus shows two peaks f1 and f2, as schematically illustrated in FIG. 3B. If on the other hand the object is moving towards the laser, a frequency spectrum with two frequency peaks is again obtained, but now the lower frequency is obtained during the periods that the current magnitude is decreasing. It should be clear that this information can be derived from the measuring signal relatively easily by a suitably programmed signal processor.

For a more detailed explanation, reference is made to U.S. Pat. No. 7,339,683, the contents of which is incorporated here by reference.

SUMMARY OF THE INVENTION

One problem of the prior art method relates to the fact that a triangular modulator is required. It is therefore an objective of the present invention to provide a method and device capable of detecting the direction of motion without the need of a generator for triangular signals.

Another problem of the prior art is a basic problem related to the physics underlying the prior art method. As mentioned, the wavelength shift of the laser light is caused by a thermal property of the laser, in other words is caused by the temperature shift resulting as a response to a change in current magnitude. The thermal response of a body is a relatively slow process, which puts boundaries to the current rise rate and the current frequency that can be applied: if the frequency is too high, the laser temperature and hence the wavelength cannot follow the current. This in turn puts limits on the velocity that can be measured reliably. According to the present state of the art, the current frequency should not be much higher than about 40 kHz which in a practical example corresponds to a velocity of about 30 cm/sec as upper limit of the velocity that can be measured. A further objective of the present invention is to be able to measure higher velocities.

According to an important aspect of the present invention, the laser current is modulated with a square wave or block signal, at a frequency higher than the thermal response frequency of the laser. Typically, the frequency will be in the order of 100 kHz or higher. The thermal response of the laser cannot follow the square wave current signal, and will approach a triangular wave. The modulation of a square wave signal can easily be implemented by a simple switch.

Further advantageous elaborations are mentioned in the dependent claims.

BRIEF DESCRIPTION OF THE DRAWINGS

These and other aspects, features and advantages of the present invention will be further explained by the following description of one or more preferred embodiments with reference to the drawings, in which same reference numerals indicate same or similar parts, and in which.

DETAILED DESCRIPTION OF THE INVENTION

Figure 1:
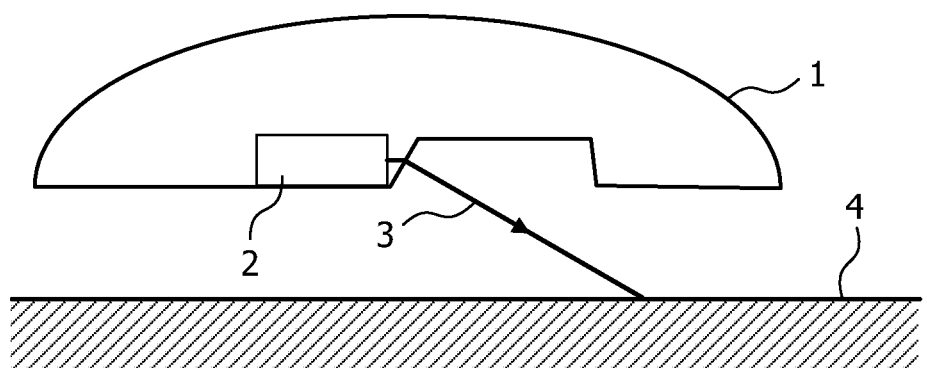
FIG. 1 schematically shows an optical computer mouse with a laser detector for detecting movement of the mouse with respect to a surface.

As regards design, a movement detector 1 can be implemented in the same way as the state of the art, therefore FIG. 1 can be considered as also illustrating an optical movement detector 1, implemented as a mouse, according to the present invention, and the above description with reference to FIG. 1 can be read again and does not need to be repeated.

Figure 2:
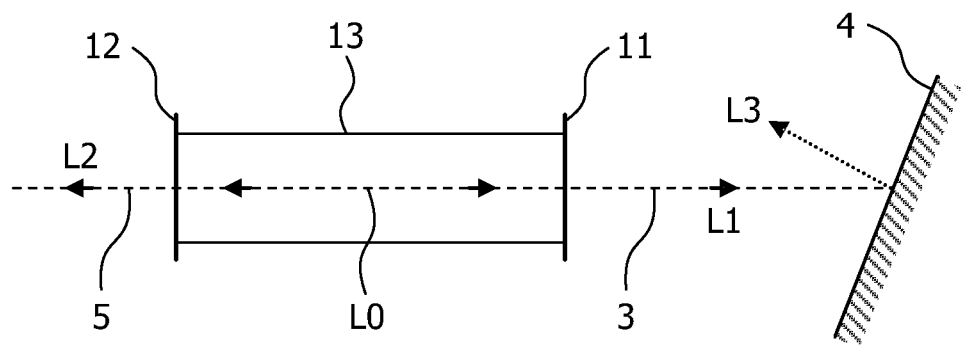
FIG. 2 is a diagram schematically illustrating the measuring principle underlying the laser movement detector.

Likewise, the measuring principle illustrated in FIG. 2 and discussed with reference to FIG. 2 also applies in the case of a movement detector according to the present invention.

Figure 4:
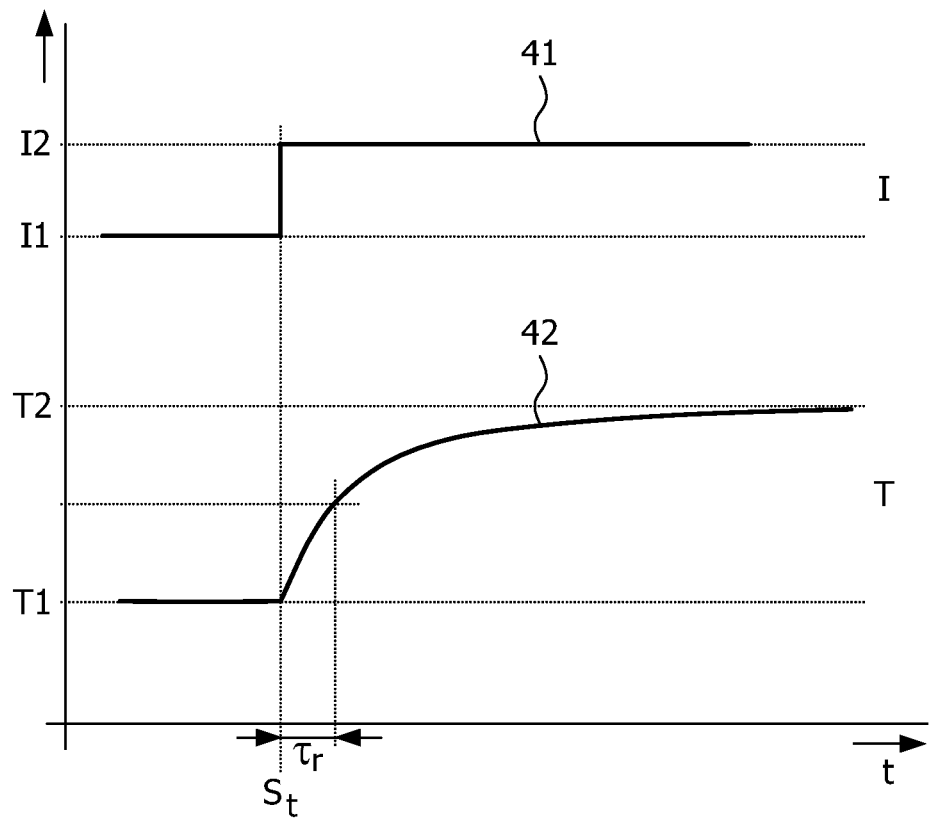
FIG. 4 is a graph illustrating the response of the laser temperature in response to a stepped change of the laser current.

FIG. 4 is a graph illustrating the response of the laser temperature T (curve 42) in response to a stepped change of the laser current I (curve 41). Before the step time ts, when the laser current is I1, the laser is in thermal equilibrium at first temperature T1. At the step time ts, the laser current is stepped to value I2, as a result of which the laser temperature will asymptotically approach a second temperature T2. At all times, at least in good approximation, the temperature change rate $R_T = dT/dt$ is proportional to the distance $|T2-T|$. During a first stage of the response, the temperature change rate $R_T$ may be approximated to be constant.

A thermal response time τr is defined, reflecting the time needed by the laser to step from first temperature T1 to second temperature T2. This thermal response time τr may be defined in various ways. In the present invention, the thermal response time τr is defined as the time needed by the laser to "travel" 0.63 (more precisely: $1-\exp(-1)$) times the temperature step $|T2-T1|$. In any case, the thermal response time τr is a physical property of the laser 2. In a practical case, the thermal response time τr may be in the order of about 0.7 μsec.

Based on the thermal response time τr, a thermal response frequency fr is defined as $fr=1/(2\pi \cdot \tau r)$, which is of course also a physical property of the laser 2.

Figure 5:
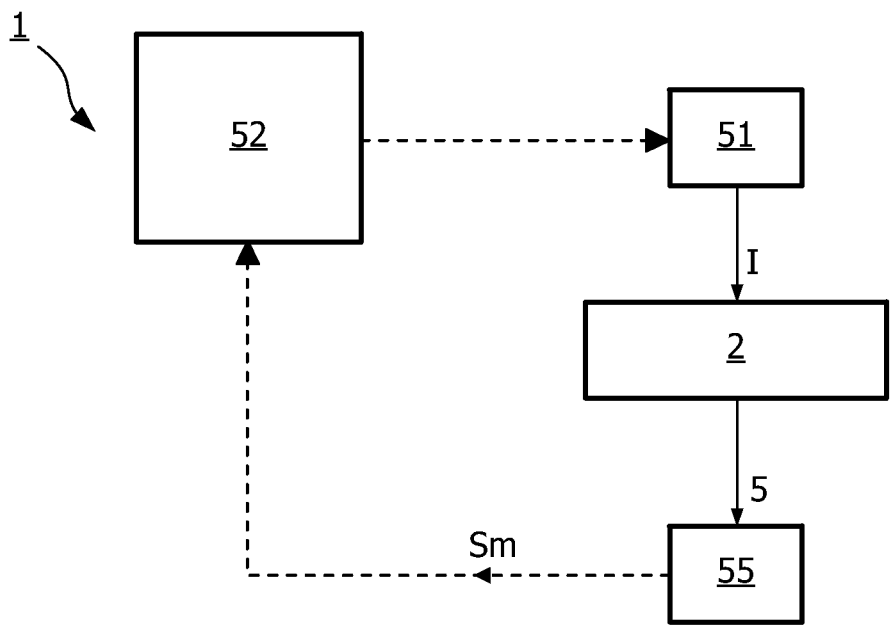
FIG. 5 is a block diagram illustrating some components of a movement detector.

FIG. 5 is a block diagram illustrating some components of the movement detector 1. The laser 2 is supplied from a laser current source 51, which is a controllable source controlled by a controller 52. The measuring beam 5 is received by a light detector 55, which provides its output signal to the controller 52.

Figure 6A:
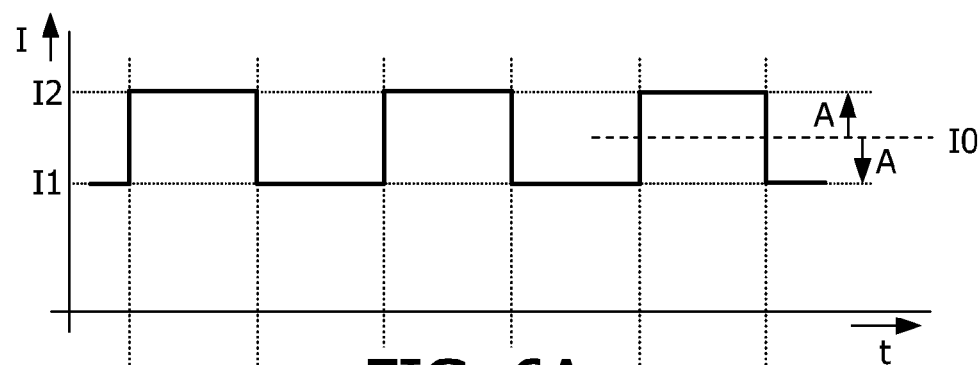
FIG. 6A is a graph illustrating rectangularly modulated DC current.

According to the invention, the controller 52 controls the laser current source 51 to generate a laser current I that will be defined as a square-wave DC current, or a rectangularly modulated DC current, illustrated in FIG. 6A. The current has always the same sign, which in FIG. 6A is taken to be positive. The laser current I can take two values, indicated as I1 and I2. During one half of the current period, the laser current is equal to I1. During the other half of the current period, the laser current is equal to I2. Typically, both current period halves have equal duration. The transition from I1 to I2 is a stepped transition, i.e. the duration of the step can be ignored; the same applies for the transition from I2 to I1. This current waveform can be described as a constant current of magnitude $I0=I1+0.5*(I2-I1)$, modulated with a square-wave AC current having amplitude $A=0.5*(I2-I1)$ smaller than the constant current magnitude I0. It is noted that this current waveform can be generated by actually generating a constant current and an AC square-wave current and adding these two currents together, or by controlling the current magnitude of the current produced by a current source.

According to a further aspect of the invention, the duration of one half of the current period is shorter than the thermal response time τr of the laser. In other words, the modulation frequency is higher than the thermal response frequency fr; preferably, the modulation frequency is higher than twice the thermal response frequency fr. Typically, the modulation frequency may be in the order of 1 MHz or higher.

Figure 3A:
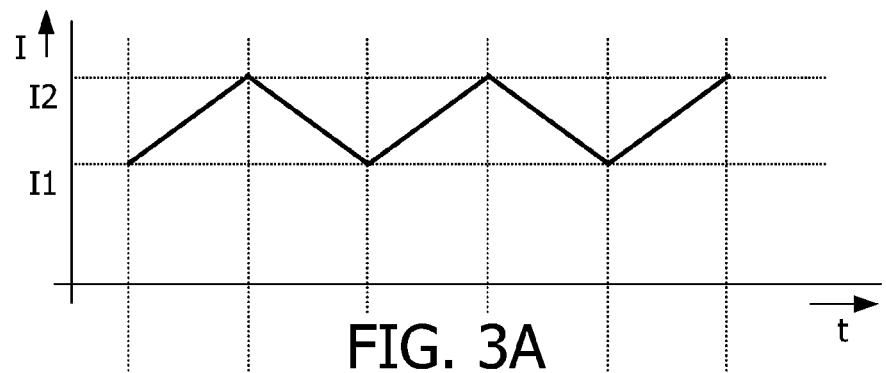
FIG. 3A schematically illustrates a triangularly modulated laser current.
Figure 3B:
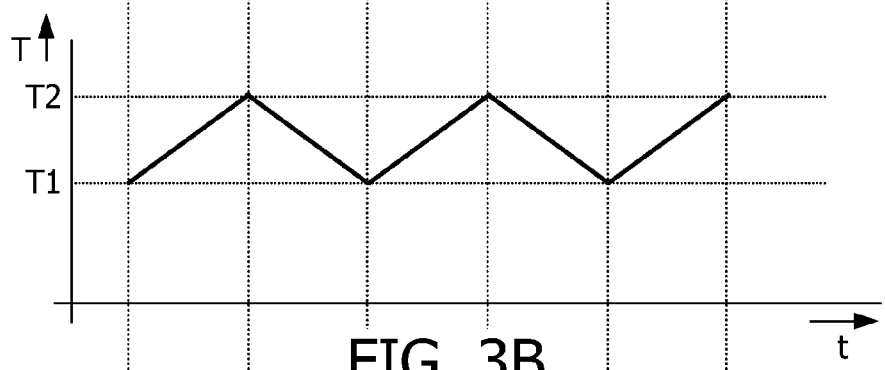
FIG. 3B schematically illustrates the laser temperature caused by the modulated laser current.
Figure 3C:
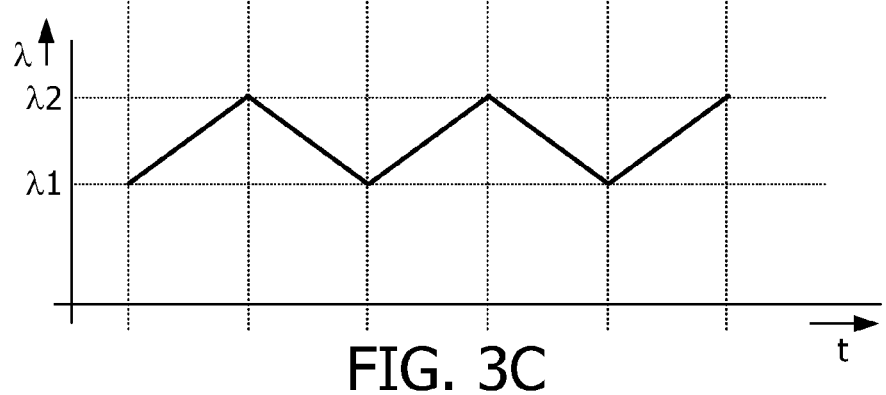
FIG. 3C schematically illustrates the laser wavelength resulting from the modulated laser temperature.
Figure 6B:
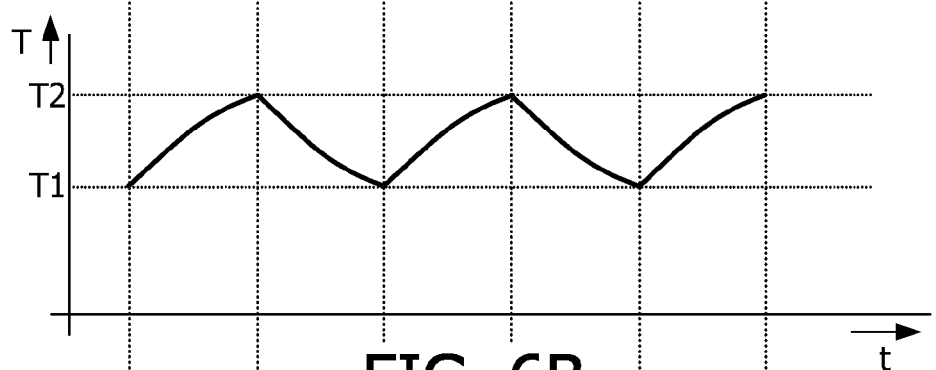
FIG. 6B is a graph illustrating the thermal response of the laser.

As a result, as explained in the above with reference to FIG. 4, the thermal response of the laser temperature will be the response during the first stage of the step response, i.e. a substantially linear temperature change with a change rate $R_T$ being substantially constant, at least in good approximation, this approximation being better as the modulation frequency is higher. In other words, the laser temperature will show a triangular modulation, see FIG. 6B. It should now be clear to a person skilled in the art that the laser wavelength will also show a triangular modulation, as illustrated in FIG. 3C. Thus, the output signal of the light detector 55 will be a signal similar to the signal obtained in prior art, at least will have a similar frequency spectrum, and can be processed in a manner similar as in prior art, so a more detailed explanation is not needed here.

Figure 3D:
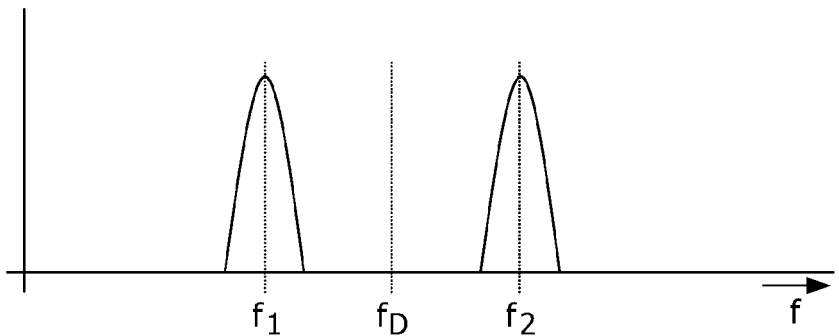
FIG. 3D schematically illustrates the frequency spectrum of the laser detector output signal in the case of a movement.

The controller 52 is designed to analyze the frequency spectrum of the detected light L2 in conjunction with the momentary magnitude I1; I2 of the laser current I in order to determine the direction of movement of the object 4. At a time scale smaller than the modulation period, this frequency spectrum will show a peak at a smaller frequency f1 or at a higher frequency f2, as illustrated in FIG. 3D. If the controller finds that the frequency spectrum shows the peak at smaller frequency f1 when the momentary current magnitude is the higher value I2 while the frequency spectrum shows the peak at higher frequency f2 when the momentary current magnitude is the lower value I1, the controller decides that the object 4 is moving away from the laser. Conversely, if the controller finds that the frequency spectrum shows the peak at smaller frequency f1 when the momentary current magnitude is the lower value I1 while the frequency spectrum shows the peak at higher frequency f2 when the momentary current magnitude is the higher value I2, the controller decides that the object 4 is moving towards the laser.

Figure 6C:
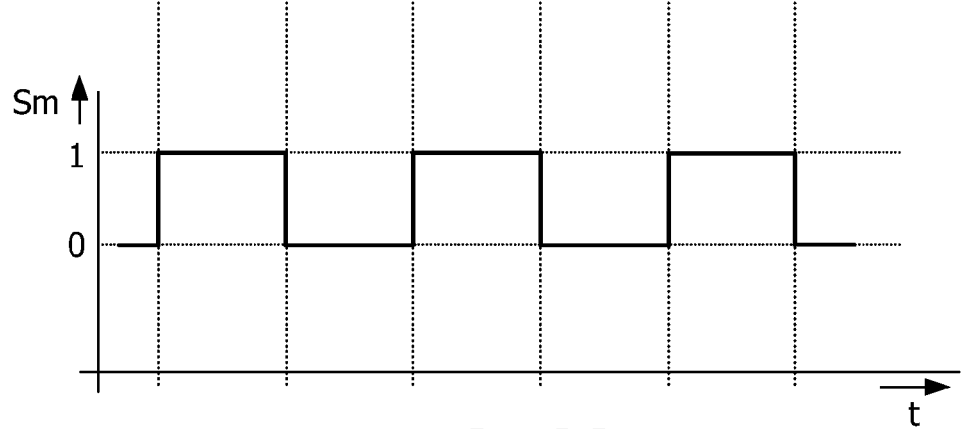
FIG. 6C is a graph illustrating a measuring signal.

The detector 55 may generate a signal Sm of which the momentary value indicates the frequency of the frequency peak, as illustrated in FIG. 6C. It is also possible that the controller 52 derives such a signal. Assume that a higher value of the signal Sm corresponds to the frequency peak having the higher frequency f2 while a lower value of the binary signal Sm corresponds to the frequency peak having the lower value f1. It is even possible that the signal Sm is a binary signal, "1" indicating f2 while "0" indicates f1. In such case, the measuring signal Sm being substantially in phase with the laser current indicates that the object 4 is moving towards the laser whereas the measuring signal Sm being substantially 180° out of phase with the laser current indicates that the object 4 is moving away from the laser.

As a consequence of the higher modulation frequency, the modulation depth of the laser temperature, i.e. |T2−T1|, will be relatively small. If this turns out to be problematic, it is possible to increase this modulation depth of the laser temperature by increasing the modulation depth of the laser current, i.e. |I2−I1|. If this would be undesirable, it is also possible to implement a different signal processing technique that is more sensitive as compared to the technique implemented in prior art. An example of such different signal processing technique is quadrature demodulation; it is noted that quadrature demodulation can also be applied in the prior art system, if desired.

Figure 7:
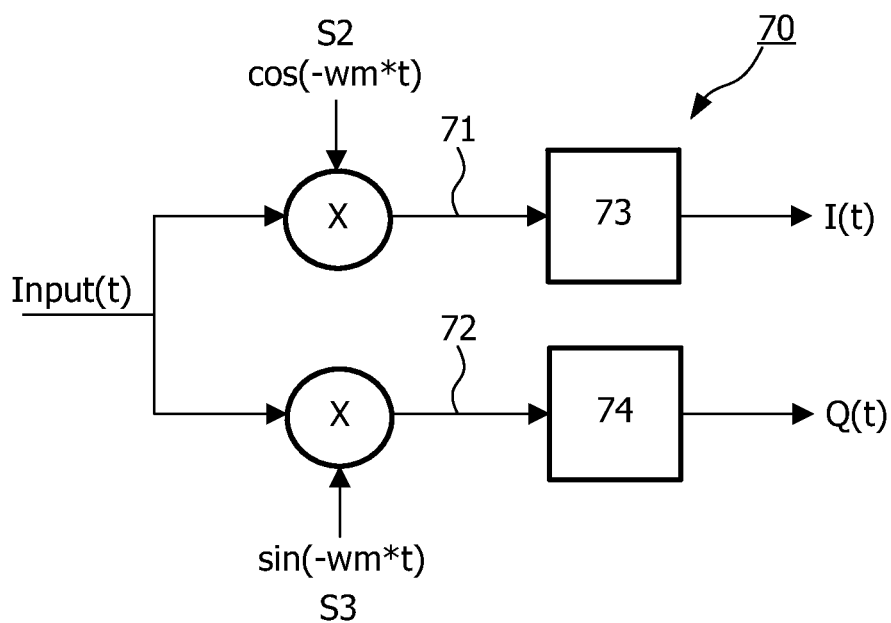
FIG. 7 is a block diagram schematically illustrating a quadrature demodulator.

A typical quadrature demodulator 70 is shown in FIG. 7. An input signal Input(t) is provided to two mixers 71 and 72 that each multiply the input signal with a second and a third signal S2 and S3, respectively. The second and third signals are usually generated by a local source (not shown) that provides frequency of radial frequency −wm as cos(−wm*t) and its 90 degree phase-shifted version as sin(−wm*t). The outputs of the mixers are often (but need not be) filtered by filters 73 and 74, respectively, to reject unwanted images of the mixing process. This results in the in-phase signal I(t) and the quadrature signal Q(t). This process is (for the example where the filter is not used) conveniently described in complex notation:

Output(*t*)=*I*(*t*)+*i*\**Q*(*t*)=Input(*t*)\*exp(*i*\*−*wm*\**t*)

Thus the real input signal is converted to a complex output signal. In most practical applications the input signal Input(t) is of the form:

Input(*t*)=Re(*A*(*t*)\*exp(*i*\**f*(*t*))\*exp(*i*\**wm*\**t*))

Input(*t*)=*A*(*t*)\*cos(*f*(*t*)+*wm*\**t*)

Where wm is a carrier wave frequency, A(t) is an amplitude envelope and f(t) is a signal phase, where usually df/dt<<wm. The information carrying signal in this case is a complex signal A(t)*exp(i*f(t)). Thus the output signal of the demodulator becomes:

Output(*t*)=*A*(*t*)\*cos(*f*(*t*)+*wm*\**t*)\*(cos(−*wm*\**t*)+*i*\*sin(−*wm*\**t*))

Output(*t*)=0.5\**A*(*t*)\*{cos(*f*(*t*))+cos(*f*(*t*)+2*wm*\**t*)+*i*\*[sin(*f*(*t*))−sin(*f*(*t*)+2*wm*\**t*)]}

Output(*t*)=0.5\**A*(*t*)\*{cos(*f*(*t*))+*i*\*sin(*f*(*t*))+cos(*f*(*t*)+2*wm*\**t*)−*i*\*sin(*f*(*t*)+2*wm*\**t*)}

Output(*t*)=0.5\**A*(*t*)\*{exp(*i*\**f*(*t*))−exp(*i*\*(*f*(*t*)+2*wm*\**t*))}

This is the original input signal (apart from a factor 0.5) plus a high-frequency signal centered around 2*wm. Usually a filter as shown is used to reject unwanted signals such as signals centered around 2*wm. This results in an output signal:

Output(*t*)=0.5\**A*(*t*)\*exp(*i*\**f*(*t*))

Thus the original complex input signal is recovered, even though it was transmitted through a channel that only transmits real signals.

A selfmixing sensor output signal is a similar signal in the sense that the detector output is a real signal, whereas the optical feedback signal into the laser cavity that causes the laser selfmixing has both an amplitude and a phase. Whereas the amplitude of this feedback signal depends on the properties of the scattering mirror, the phase of this signal, relative to the phase of the laser output, depends on the distance to the scattering mirror, its reflection phase and the laser wavelength. This is described in the formula below:

Feedback(*t*)=*A*(*t*)\*exp[*i*\*(*r*(*t*)+2\**pi*\**L*(*t*)/lambda(*t*)]

*L*(*t*)=*L*0+2*v*\**t*

Where L(t) is the roundtrip (2 times the distance) length to the scattering mirror. v(t) is the object speed in the direction of the laser beam. A(t) is the time varying reflectivity of the scattering mirror back to the laser as the object moves. r(t) is the time varying mirror reflection phase. lambda(t) is the time varying laser wavelength, where the variation is much smaller than the wavelength itself so that:

1/lambda(*t*)=1/[1*d*0+*d*1*d*(*t*)]=[1−*d*1*d*(*t*)/1*d*0]/1*d*0 to a very good approximation, where **1*d*0** is the average wavelength and d1*d*(t) is the wavelength variation. Thus we get:

Feedback(*t*)=*A*(*t*)\*exp{*i*\*[*r*(*t*)+2\**pi*\*(1−*d*1*d*(*t*)/1*d*0)\*(*L*0+2*v*\**t*)/1*d*0]}

For v*t<<L0, that is either a short measurement interval or a near constant distance between laser beam and a scattering mirror surface to be measured where the laser beam incident on the surface has an angle with that surface other than 90 degrees and the surface has a velocity component v in the direction of the laser beam, this is simplified to:

Feedback(*t*)=*A*(*t*)\*exp{*i*\*[*r*'(*t*)−2\**pi*\**d*1*d*(*t*)/1*d*0\**Nr*+4*pi*\**v*\**t*/1*d*0]}

Where r'(t) includes the constant factor 2*pi*L0/1d0 and Nr is the number of optical periods in the roundtrip length Nr=L0/1d0. Note that the sign of v can be detected in this feedback signal by simply analyzing the phase term in the exponent and knowing d1d(t). However the detector signal is not a complex signal, and thus recovery of the sign of v becomes more difficult.

The selfmixing detector signal into the quadrature demodulator is of the form:

$$\text{Input}(t) = Re\{A(t)*\exp\{i*[r''(t)-p(t)+4pi*v*t/1d0]\}\}$$

Where r''(t) is r'(t) including a fixed phase offset between the feedback signal phase and the selfmixing detector signal phase. The phase modulation due to wavelength modulation is:

$$p(t) = -2*pi*Nr*d1d(t)/1d0$$

This signal is provided to the quadrature demodulation, where the quadrature demodulation local signals:

$$\cos(-wm*t) \text{ and } \sin(-wm*t) \text{ are chosen as: } \cos(-p(t)) \text{ and } \sin(-p(t))$$

For a triangular modulation of the laser wavelength, as obtained with the square wave modulation of the laser current that is the same as choosing:

$$-wm = dp(t)/dt$$

Where dp/dt is piece-wise constant per modulation segment. Thus the demodulated signal output is of the form:

$$\text{Output}(t) = 0.5*A(t)*\{\exp(i*f(t))-\exp(i*(f(t)+2*p(t))\}$$

$$\text{Output}(t) = 0.5*A(t)*\{\exp(i*f(t))-\exp(i*(f(t))*\exp(2i*p(t))\}$$

Where f(t)=r''(t)+4pi*v*t/1d0, the wanted selfmixing signal phase and A(t) is the wanted selfmixing signal amplitude. r''(t) is the selfmixing signal detection phase, that has a slow random variation due to speckle in the diffuse mirror reflection. The speed v gives an angular frequency 4pi*v/1d0, that is a Doppler frequency fd=2*v/1d0. Thus the output signal contains a description of the complex selfmixing signal, however it also contains an unwanted component containing p(t).

A straightforward method to separate the component with p(t) is to choose p(t) of a triangular shape (as is obtained with square wave laser modulation) between 0 and N*pi and of a high frequency (Where N is an integer of at least 1). Then exp(2i*p(t)) has an average of zero and for slowly varying f(t) the unwanted signal component is suppressed by a simple low pass filter. It should be noted that the square wave laser modulation does add a component to A(t):

$$A(t) = As(t)*(1+m(t))$$

Where As(t) is the unperturbed selfmixing signal amplitude and m(t) is a square wave, where |m(t)|<<1. For a high modulation rate for m(t) this component is easily rejected by low-pass filtering.

The complex output signal can be provided to a complex Fourier transform, which has the ability to detect both positive and negative frequencies separately (unlike a real Fourier transform that cannot differentiate between positive and negative frequency). Because of this it can differentiate between positive and negative values of speed v. Even an unfiltered output signal can be provided to a complex Fourier transform. In this case the unwanted signal products due to p(t) and m(t) will cause spectral peaks at frequencies that are usually different from the Doppler frequency fd and with known frequency (such as m(t) and harmonics thereof) and known relation to fd, such as the phase modulation of a signal at frequency fd due to term p(t). For instance for sinusoidal phase modulation p(t) the spectrum around fd is described by a well known Bessel-series. Thus the spectrum resulting from the complex Fourier transform can be analyzed to determine the frequency fd, even if fd has high values of the same order of magnitude or greater than the frequency of m(t).

In some cases spectrum analysis may be difficult for instance when the frequency of m(t) and the Doppler frequency fd coincide, thus the measurement system may adapt the frequency of m(t) as a function of speed to be able to cover different speed ranges. As the frequency of m(t) is changed the amplitude of m(t) would also need to be changed in case the amplitude of the wavelength modulation and thus of p(t) is to remain the same due to the thermal response time constant of the laser. This can be preferable to simplify processing of the spectra, but is not required. If the amplitude of p(t) changes then this simply results in another spectrum that can be known. The shape of the spectrum in fact can be used to determine the phase modulation depth (that is the amplitude of p(t)). Such a spectrum analysis can be a preferred method to determine the phase modulation depth and to control this modulation depth to a preferred value by changing the frequency and/or the amplitude of square wave modulation signal m(t).

It should be noted that the output signal of the quadrature demodulator could also be processed by other means than a Fourier transform. For instance well-known frequency locked loop or phase locked loop designs can be used that can also distinguish between positive and negative frequency when a quadrature (I and Q or complex) input signal is provided. Some of these other methods of frequency determination suffer from a limited lock range, this means that they have to be tuned to a frequency close enough to the frequency fd to be able to lock to it and to track it. In order to find the proper starting value again a complex Fourier transform may be used to support the initial lock process and to guard against a possible loss of lock. Such a system would offer the combined advantage of spectrum analysis allowing instant lock to a frequency fd and determination of phase modulation depth and the precision of long-term tracking of the selfmixing signal phase by a frequency locked loop or a phase locked loop.

Summarizing, the present invention provides a method for detecting motion direction of an object 4, which method comprises the steps of:

laser output light L1 is generated, using a semiconductor laser 2 having a thermal response frequency fr;

the laser is driven with rectangularly modulated DC current I having a modulation frequency higher than said thermal response frequency fr and preferably higher than twice said thermal response frequency fr, such as to triangularly modulate the wavelength of the laser output light;

the laser output light is directed to the object;

a portion of reflected light L3 is allowed to interfere with light L0 within the laser;

a portion of the laser light is used as measuring beam 5;

the frequency spectrum of the measuring beam 5 is analyzed in conjunction with the modulated laser current in order to determine the direction of movement of the object 4.

This analyzing of the frequency spectrum of the measuring beam is done either by separate spectrum analysis on up- and down-modulation segments of the laser wavelength or by analysis of the frequency content of a quadrature demodulated signal such that the frequency corresponding to the object speed is discriminated from other frequencies in the spectrum. For the case of quadrature demodulation, the spectrum analysis can further include a detection of the selfmixing signal phase modulation depth due to the wavelength modulation and this can be used to control frequency and/or amplitude of the square wave modulation signal to the laser.

While the invention has been illustrated and described in detail in the drawings and foregoing description, it should be clear to a person skilled in the art that such illustration and description are to be considered illustrative or exemplary and not restrictive. The invention is not limited to the disclosed embodiments; rather, several variations and modifications are possible within the protective scope of the invention as defined in the appending claims.

For instance, the basic principles of the present invention can be applied to modulate the temperature of any semiconductor body to which a current is applied. Further, the basic principles of the present invention can be applied to modulate the laser wavelength of any semiconductor laser.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

In the above, the present invention has been explained with reference to block diagrams, which illustrate functional blocks of the device according to the present invention. It is to be understood that one or more of these functional blocks may be implemented in hardware, where the function of such functional block is performed by individual hardware components, but it is also possible that one or more of these functional blocks are implemented in software, so that the function of such functional block is performed by one or more program lines of a computer program or a programmable device such as a microprocessor, microcontroller, digital signal processor, etc.

The invention claimed is:

1. A motion detector, comprising:
a laser comprising a semi-transparent front mirror, a semi-transparent rear mirror, and a semiconductor laser body having a thermal response frequency between said two mirrors, the laser being configured to generate laser light within the laser body and to output a portion of the laser light at its front mirror as output light directed toward an object, and to output measuring light at its rear mirror, the laser further being designed to allow at least a portion of reflected light from the object to interfere with the laser light;
a controllable laser current source configured to supply the laser with laser current such as to generate the laser light within the laser body;
a controller configured to control the laser current source;
a light detector for detecting at least a portion of the measuring light;
wherein the controller is configured to control the laser current source such that it generates the laser current as a rectangularly modulated DC current having an amplitude and having a modulation frequency which is greater than said thermal response frequency so as to triangularly modulate the wavelength of the laser output light,
wherein the controller is also configured to analyze the frequency spectrum of the detected measuring light in conjunction with the modulated laser current in order to determine a direction of relative movement of the object with respect to the motion detector, and
wherein the controller is further configured to adjust modulation frequency of the rectangularly modulated DC current as a function of a speed of the relative movement of the object with respect to the motion detector,
wherein the controller is further configured to adjust the amplitude of the rectangularly modulated DC current as the modulation frequency is adjusted so as to maintain a phase modulation depth of the laser light to be constant.

2. The motion detector of claim 1, wherein the controller is configured to analyze the measuring signal in conjunction with the phase of the laser current.

3. The motion detector of claim 1, wherein the controller is configured to analyze the frequency spectrum of the detected light by separate spectrum analysis on up- and down-modulation segments of the laser wavelength.

4. The motion detector of claim 1, further comprising a quadrature demodulator receiving the detector output signal and providing a quadrature demodulated signal to the controller, and wherein the controller is configured to analyze the frequency spectrum of the detected light by analysis of the frequency content of the quadrature demodulated signal such that a frequency corresponding to a speed of the relative movement of the object is discriminated from other frequencies in the spectrum.

5. A method for detecting a direction of relative movement of an object with respect to a semiconductor laser, the method comprising the steps of;
generating laser light using the semiconductor laser, the semiconductor laser having a thermal response frequency;
driving the laser with a rectangularly modulated Dc laser current having an amplitude and a modulaiton frequency which is greater than said thermal response frequency such as to triangularly modulate the wavelength of the laser light;
outputting a portion of the laser light as output light, the output light being directed toward the object;
allowing a portion of reflected light form the object interfere with the laser light;
using a portion of the laser light as a measuring beam
analyzing the frequency spectrum the measuring beam in conjunction with the modulated laser current in order to determine the direction of the relative movement of the object;
adjusting the modulation frequency of the rectangularly modulated DC current as a function of a speed of the relative movement of the object with respect to the motion detector; and
adjusting the amplitude of the rectangularly modulated DC current as the modulation frequency is adjusted so as to maintain a phase modulation depth of the laser light to be constant.

6. The method of claim 5, wherein the step of analyzing the frequency spectrum of the measuring beam is done by separate spectrum analysis on up- and down-modulation segments of the laser wavelength.

7. The method of claim 5, wherein the step of analyzing the frequency spectrum of the measuring beam is done by analysis of the frequency content of a quadrature demodulated signal such that a frequency corresponding to a speed of the relative movement of the object is discriminated from other frequencies in the spectrum.

* * * * *